(12) United States Patent
Van Tuijl

(10) Patent No.: US 7,102,559 B2
(45) Date of Patent: Sep. 5, 2006

(54) ANALOG-TO-DIGITAL CONVERTER HAVING INTERLEAVED COARSE SECTIONS COUPLED TO A SINGLE FINE SECTION

(75) Inventor: Adrianus Johannes Maria Van Tuijl, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/542,136

(22) PCT Filed: Jan. 12, 2004

(86) PCT No.: PCT/IB2004/050007

§ 371 (c)(1),
(2), (4) Date: Jul. 12, 2005

(87) PCT Pub. No.: WO2004/066504

PCT Pub. Date: Aug. 5, 2004

(65) Prior Publication Data

US 2006/0055575 A1    Mar. 16, 2006

(30) Foreign Application Priority Data

Jan. 17, 2003  (EP) ................... 03100094
Jul. 11, 2003  (EP) ................... 03102127

(51) Int. Cl.
*H03M 1/12*  (2006.01)
*H03M 1/36*  (2006.01)

(52) U.S. Cl. ...................... 341/156; 341/159
(58) Field of Classification Search ............... 341/156, 341/155, 161, 166, 172, 122, 118, 120, 143, 341/144, 145, 162, 165, 141, 159
See application file for complete search history.

(56) References Cited

U.S. PATENT DOCUMENTS

| | | | | |
|---|---|---|---|---|
| 4,733,217 A * | 3/1988 | Dingwall | ................... | 341/122 |
| 5,006,853 A * | 4/1991 | Kiriaki et al. | ............... | 341/156 |
| 5,053,771 A * | 10/1991 | McDermott | ................ | 341/156 |
| 5,126,742 A * | 6/1992 | Schmidt et al. | ............. | 341/156 |
| 5,138,319 A | 8/1992 | Tesch | .......................... | 341/156 |
| 5,262,779 A | 11/1993 | Sauer | .......................... | 341/161 |
| 5,353,027 A * | 10/1994 | Vorenkamp et al. | ........ | 341/156 |
| 5,489,904 A * | 2/1996 | Hadidi | ....................... | 341/156 |
| 5,585,796 A | 12/1996 | Svensson et al. | ........... | 341/155 |
| 5,621,409 A | 4/1997 | Cotter et al. | ................ | 341/156 |
| 5,675,340 A | 10/1997 | Hester et al. | ............... | 341/156 |
| 5,682,163 A | 10/1997 | Hsu | ........................... | 341/156 |
| 5,689,260 A * | 11/1997 | Vallancourt | ................. | 341/156 |
| 5,696,510 A * | 12/1997 | Paillardet et al. | ........... | 341/156 |
| 5,745,067 A * | 4/1998 | Chou et al. | ................. | 341/156 |
| 5,973,632 A * | 10/1999 | Tai | ............................. | 341/156 |
| 6,121,912 A * | 9/2000 | Brandt | ....................... | 341/156 |
| 6,177,899 B1 * | 1/2001 | Hsu | ........................... | 341/156 |
| 6,177,901 B1 * | 1/2001 | Pan et al. | .................... | 341/166 |
| 6,340,943 B1 * | 1/2002 | Chow et al. | ................ | 341/161 |
| 6,590,518 B1 * | 7/2003 | Taft | ........................... | 341/156 |
| 6,653,966 B1 * | 11/2003 | van der Goes et al. | ..... | 341/156 |

* cited by examiner

Primary Examiner—Patrick Wamsley

(57) ABSTRACT

An analog-to-digital conversion arrangement for converting an analog input signal into a digital output signal with a most significant part and a least significant part comprises sample means for sampling the analog input signal, a plurality of coarse resolution analog-to-digital converters for converting the sampled analog input signal into a coarse digital signal representing the most significant part of the digital output signal, whereby the coarse resolution analog-to-digital converters are operated in an interleaved way. The analog-to-digital conversion arrangement further comprises a fine resolution analog-to-digital converter for converting the sampled analog input signal into a fine digital signal representing the least significant part of the digital output signal, based upon the coarse digital signal generated by any of said coarse resolution analog-to-digital converters.

11 Claims, 5 Drawing Sheets

ANALOG-TO-DIGITAL CONVERTER HAVING INTERLEAVED COARSE SECTIONS COUPLED TO A SINGLE FINE SECTION

BACKGROUND OF THE INVENTION

The invention relates to an analog-to-digital conversion arrangement for converting an analog input signal into a digital output signal with a most significant part and a least significant part, comprising sample means for sampling the analog input signal, a plurality of coarse resolution analog-to-digital converters for converting the sampled analog input signal into a coarse digital signal representing the most significant part of the digital output signal, whereby the coarse resolution analog-to-digital converters are operated in an interleaved way.

Such an analog-to-digital conversion arrangement is known from U.S. Pat. No. 5,262,779. In this document's a conversion arrangement is described with coarse and fine resolution analog-to-digital converters, arranged in parallel configurations of subsequently a coarse and a fine resolution analog-to-digital converter operating in an interleaved way to increase the sample rate. To match differences, caused by offset and gain differences, between the parallel configurations, autocalibration is applied.

A disadvantage of this known conversion arrangement is that the coarse and fine analog-to-digital converters in each of the parallel conversion channels must have the accuracy needed to obtain the desired resolution of the digital output signal, while further specific autocalibration means are required and a relatively high energy consumption is obtained.

SUMMARY OF THE INVENTION

The purpose of the invention is to obviate or at least to mitigate these disadvantages and to provide for an analog-to-digital conversion arrangement, which is less complicated, and in which circuit blocks are shared in order to save energy and chip area, while mismatch problems are prevented or decreased.

Therefore, according to the invention, the analog-to-digital conversion arrangement as defined in the opening paragraph, is characterized in that the analog-to-digital conversion arrangement further comprises a fine resolution analog-to-digital converter for converting the sampled analog input signal into a fine digital signal representing the least significant part of the digital output signal, based upon the coarse digital signal generated by any of said coarse resolution analog-to-digital converters. The conversion arrangement according to the invention provides for a combination of interleaved coarse resolution analog-to-digital converters, all cooperating with one single fine resolution analog-to-digital converter. This means that part of the conversion arrangement, determining the accuracy of the conversion arrangement, is common for all interleaved coarse conversion channels, so that circuit blocks are shared, while mismatch problems are prevented or strongly reduced.

Although various types of coarse and fine analog-to-digital converters can be used, for example flash analog-to-digital converters, in a particular embodiment these coarse and/or fine resolution analog-to-digital converters are formed by successive approximation analog-to-digital converters. It is possible to form the coarse resolution converters by flash converters and the fine resolution converter by a successive approximation converter; although flash converters have the disadvantage that they need more circuit blocks, they have the advantage that more bits can be determined at the same time in the same clock period, while in successive approximation converters more clock periods are necessary to determine the successive bits. Also it is possible to apply successive approximation converters as coarse resolution converters and a flash converter as the fine resolution converter.

By forming the coarse resolution analog-to-digital converters as overranging successive approximation analog-to-digital converters, the accuracy of these converters can be lower than the accuracy required to obtain the desired resolution of the digital output signal. Only the fine resolution analog-to-digital converter needs to have the required high accuracy. In this way the specifications of the coarse analog-to-digital converters may be relaxed, thereby facilitating a simplification of the design of the analog-to-digital conversion arrangement.

The invention further relates to a method for converting an analog input signal into a digital output signal with a most significant part and a least significant part, comprising:

sampling the analog input signal by sampling means;

converting the sampled analog input signal into a coarse digital signal by a plurality of coarse resolution analog-to-digital converters operated in an interleaved way, the coarse digital signal representing the most significant part of the digital output signal.

According to the invention this method is characterized in that it further comprises:

converting the sampled analog input signal into a fine digital signal by a fine resolution analog-to-digital converter and using the coarse digital signal generated by any of said coarse resolution analog-to-digital converters, the fine digital signal representing the least significant part of the digital output signal.

The invention further relates to a system for signal processing in, for example, video and communication applications wherein high speed data conversion is required, and in which the analog-to-digital conversion arrangement as described above is applied.

BRIEF DESCRIPTION OF THE DRAWINGS

The above and other objects and features of the present invention will become more apparent from the following detailed description considered in connection with the accompanying drawings, in which.

DETAILED DESCRIPTION OF THE INVENTION

Figure 1:
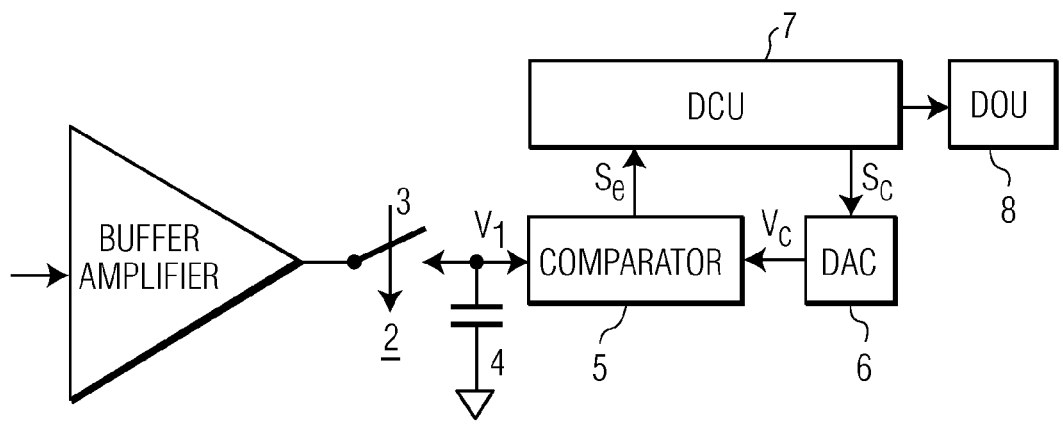
FIG. 1 shows an embodiment of a successive approximation analog-to-digital converter being applied in the analog-to-digital conversion arrangement according to the invention.

The successive approximation analog-to-digital converter of FIG. 1 comprises a buffer amplifier 1, a sample and hold circuit 2, formed by a switch 3 and a capacitor 4, a comparator 5, a digital-to-analog converter 6, a digital control unit 7 and a digital output unit 8. From an input voltage of the successive approximation analog-to-digital converter a series of time discrete voltage samples with values $V_i$ is derived via the buffer amplifier and the sample and hold circuit. In the comparator 5 the sample voltage values are compared with control voltages values $V_c$ obtained from the digital control unit 7 via the digital-to-analog converter 6. In response to the comparator output signals $S_d$, by means of an successive approximation method the bits of a converted input sample voltage value will be determined in the digital control unit 7, beginning with the most significant bit, and supplied by the digital output unit 8. The latter unit supplies the digital value of the analog input signal of the successive approximation analog-to-digital converter.

In a more simple form the successive approximation analog-to-digital converter operates without so-called overranging. This means that the voltage range for the determination of a bit value is divided in only two separated regions and by means of a single comparator unit is determined in which region the sample voltage value lies, which region again is divided into two separated regions and so on. However, as will be explained hereinafter, for a coarse analog-to-digital conversion the application of overranging is favorable. This means that the voltage range for the determination of a bit value is divided in overlapping regions, particularly three regions, and by means of more comparator units is determined whether the sample voltage value lies only in one of the outmost voltage regions or in more than one voltage region. In the present application it will be supposed that, in the case of overranging, the voltage range of the sample input value is divided into three regions, so that the comparator 5 in that case may comprise two comparator units. Based upon the comparison results a chosen region is again divided into three regions, and so on. Instead of two comparator units it is possible to use only one comparator and to perform the two comparison actions one after the other; in that case the conversion needs more time. In general overranging makes it possible to determine more bits at the same time; this mean that overranging includes some aspects of flash conversion.

Figure 2A:
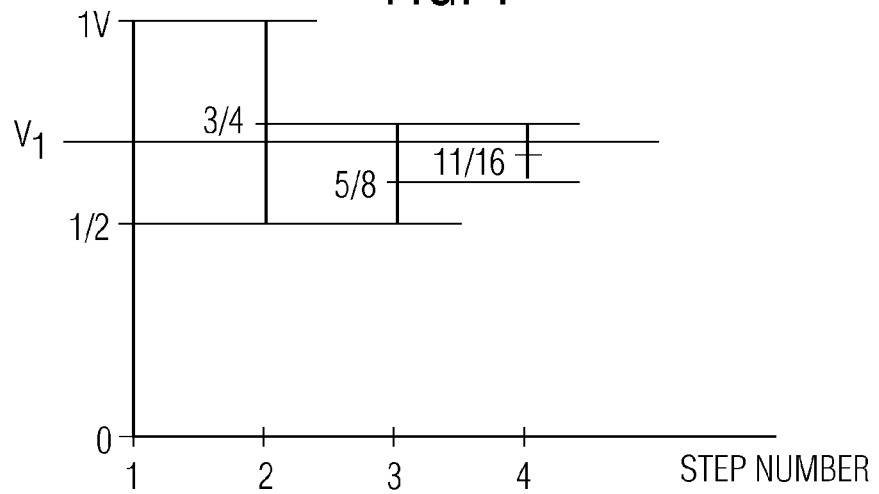
FIGS. 2A and 2B are diagrams to clarify the operation of a successive approximation analog-to-digital converters without and with overranging.
Figure 2B:
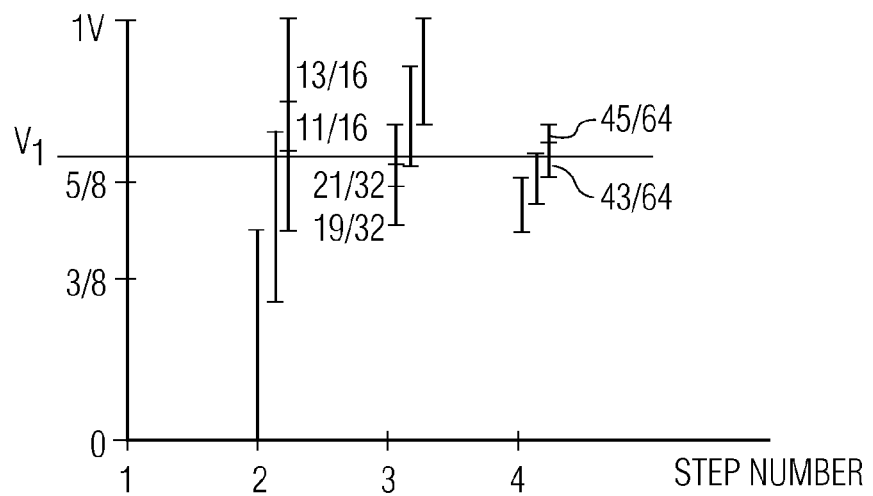

The operation of the successive approximation analog-to-digital converter without and with overranging will be explained with reference to FIGS. 2a and 2b, wherein the full range of the sample input value $V_i$ is scaled from 0 to 1 V. It is supposed that the analog input values are converted in only 4 bits. It will be clear that this number is arbitrary; in practice this number will be much larger.

Starting from a value 0000, in a first step in the digital control unit 7 the first bit of this value is made high and a signal $S_c=1000$ is supplied to the digital-to-analog converter 6. This value corresponds with ½ V. In the example illustrated in FIG. 2a, $V_i>½$ V, whereupon the comparator 5 supplies a signal "1" to the digital control unit 7 and the first bit "1" of the digital output signal is determined, in a second step the digital control unit makes the second bit high and supplies a signal $S_c=1190$ to the digital-to-analog converter 6.

This value corresponds with ¾ V. In this example $V_i<¾$ V, so that the comparator 5 supplies a signal "0" to the digital control unit 7, whereupon the second bit of the digital output signal is determined as being "0". In a third step the third bit is made high and the resulting signal $S_c=1010$ is supplied to the digital-to-analog converter 6. This signal corresponds with a value ⅝ V. As shown in FIG. 2a, $V_i>⅝$ V, whereupon the comparator 5 supplies a signal "1", so that the third bit is maintained in the digital output signal. In the fourth step the fourth bit is made high, whereupon the digital control unit 7 supplies a signal $S_c=1011$ to the analog-to-digital converter 6. The latter value corresponds with 11/16 V. Again, as shown in this example $V_i>11/16$ V, whereupon the comparator supplies a signal "1" to the digital control unit 7, the fourth bit is maintained and the obtained conversion result, viz. 1011, corresponding with about 0,7 V, is supplied to the digital output unit 8. Then, a next sample conversion can be started.

Now, with reference to FIG. 2b, the conversion with overranging, in this example three overlapping voltage ranges, will be explained. In a first step the digital control unit 7 generates two signals, viz. 0110 and 1010, corresponding with ⅜ V and ⅝ V. The comparator 5 in this example comprises two comparator units. In the first comparator unit the sample input value $V_i$ is compared with ⅜ V and in the second comparator unit with ⅝ V. As shown in FIG. 2b, $V_i>⅝$ V, with the consequence that by both comparator units a value "1" is supplied to the digital control unit 7. During the conversion process bits are generated which are rounded off later on; in the digital values these bits are indicated by bits behind a "point". Based on the latter comparator output signals "1, 1", a starting value 0000.0 of the digital output signal is changed into 1000.0 by a full adder operation of both "1's" to the second "0" of the starting value; with this operation the first bit of the analog-to-digital conversion is determined. As both comparator units supplied a signal "1", the most upper region is selected for comparison purposes during the second step. In the second step, in the digital control unit the next two comparator values are determined, viz. 1011 and 1101, corresponding with 11/16 and 13/16 V, lying in the upper region. As $V_i<11/16$, by both comparator units a value "0" supplied to the digital control unit 7. By means of a full adder operation of both "0's" on the third "0" of the value 1000.0, the second bit "0" of the analog-to-digital conversion is determined. As both comparator units supplied a signal "40", the most lower region is selected for comparison purposes during the third step. In the third step, in the digital control unit the next two comparator values are determined, viz. 1001.1 and 1010.1, corresponding with 19/32 and 21/32. As shown in FIG. 2b, $V_i>21/32$, with the consequence that again by both comparator units a value "1" is supplied to the digital control unit. By means of a fall adder operation of both "1's" on the fourth "0" of the value 1000.0, the third bit of the analog-to-digital conversion is determined; the value 1000.0 is changed into 1010.0. In the fourth step, in the digital control unit the next two comparator values are determined, viz. 1010.11 and 1011.01, corresponding with 43/64 and 45/64. Now $V_i>43/64$ and $V_i<45/64$, with the consequence that the first comparator unit supplies a value "1" to the digital control unit 7 and the second comparator unit a value "0". By means of a full adder operation of the values "1" and "0" on the fifth "0" of the value 1010.0 the fourth bit of the analog-to-digital conversion is determined; the value 1010.0 is changed into 1011.0. As in the present example the conversion is performed in four bits, the conversion result is rounded off and again 1011, whereafter a next sample conversion can be started.

Although in this case there is no difference in the conversion result between the conversion without overranging and with overranging, differences may occur when, without overranging, the settling time for the voltages at the entrance of the comparator during transitions between two successive sample voltage values or two successive value of the digital-to-analog converter is too long, taking into account a desired sample rate. As the output resistance of the buffer amplifier 1 and the capacitance of the capacitor 4, which is mostly a parasitic capacitance, can difficulty be adjusted, the settling constant of the sample voltage value is practically a given one. When there are great differences between two successive sample voltage values, the time necessary to approach the new sample voltage value may be unsatisfactory at a given sample rate. To decrease the sample rate, however, is mostly undesired. Also at the output of the digital converter 6 offset values or a too long settle time may occur. In those circumstances the values at one or both sides of the comparator may be incorrect.

Figure 3A:
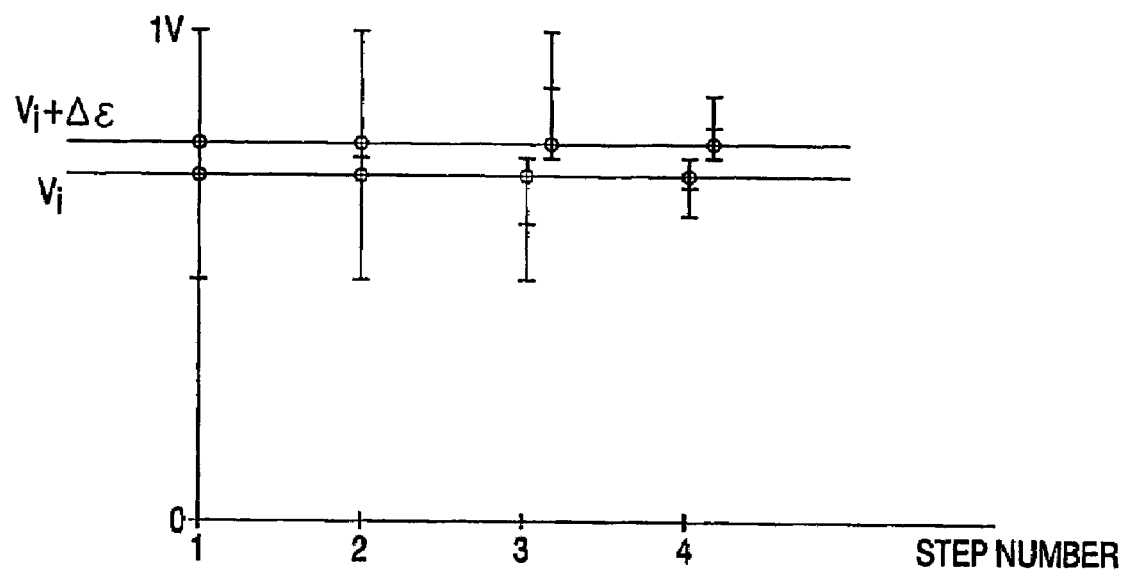
FIGS. 3A and 3B are diagrams to clarify the difference between successive approximation analog-to-digital converters without and with overranging with respect to error signals.
Figure 3B:
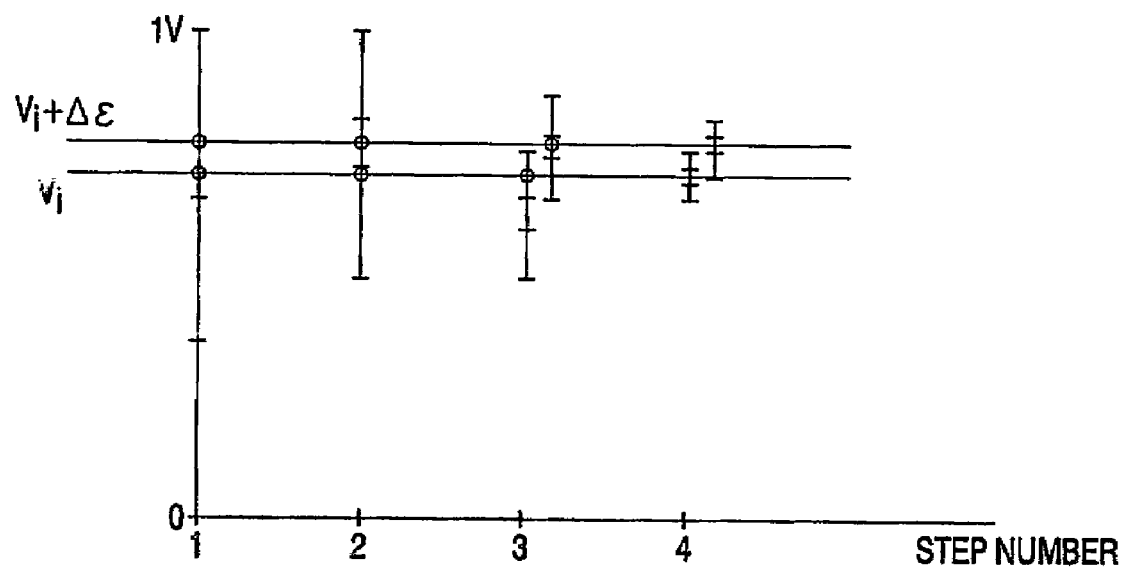

It will be shown that by applying overranging, errors of the above-described type will be diminished, while a high sample rate can still be maintained. In FIG. 3A not only the situation of FIG. 2A is depicted but also the situation of an error in the sample voltage value. Instead of the value $V_i$ the sample voltage has, as a consequence of this error, a value $V_i+\Delta\epsilon$. Following the same reasoning as given above with reference to FIG. 2A, the digital output signal will be 1100 instead of 1011 without the error. Likewise, in FIG. 3B not only the situation of FIG. 3A is depicted but also the situation of an error in the sample voltage value. Instead of the value $V_i$ the sample voltage has, as a consequence of this error, again the value $V_i+\Delta\epsilon$. Following the same reasoning as given above with reference to FIG. 2B, the digital output signal will be 1011 as is the case of FIG. 2A. So, due to the overranging, in the digital output signal there is no error. This means that with overranging a higher sample rate can be applied than without overranging.

When in a conversion arrangement as in the present invention, a difference is made between a coarse and a fine resolution analog-to-digital converter, the coarse resolution converter is preferably arranged with overranging, while the fine resolution converter can be sufficient without overranging. Indeed, in the fine resolution converter the steps between successive sample voltages are already small, so that the settle time will be small too and the same high sample rate as usable in the coarse resolution converter with overranging can be applied. In the coarse resolution converter with overranging precision, noise and settling accuracy are less critical than in the fine resolution converter; therefore, the coarse resolution converter may be composed with more cheap and less power consuming components.

As in the present invention the combination of coarse resolution converters and a fine resolution converter is implemented, in a preferable embodiment thereof the coarse resolution analog-to-digital converters may be of the type with overranging, while the fine resolution analog-to-digital converter can be of the type without overranging. Of course, the latter can also be of the type with overranging; this, however, may imply a superfluous measure. However, as a consequence of offset differences, it is possible that the coarse resolution converter supplies a "shifted signal"; in that case the fine resolution converter may need one or more bits overrange to obtain a correct co-operation with the coarse resolution converter.

Figure 4:
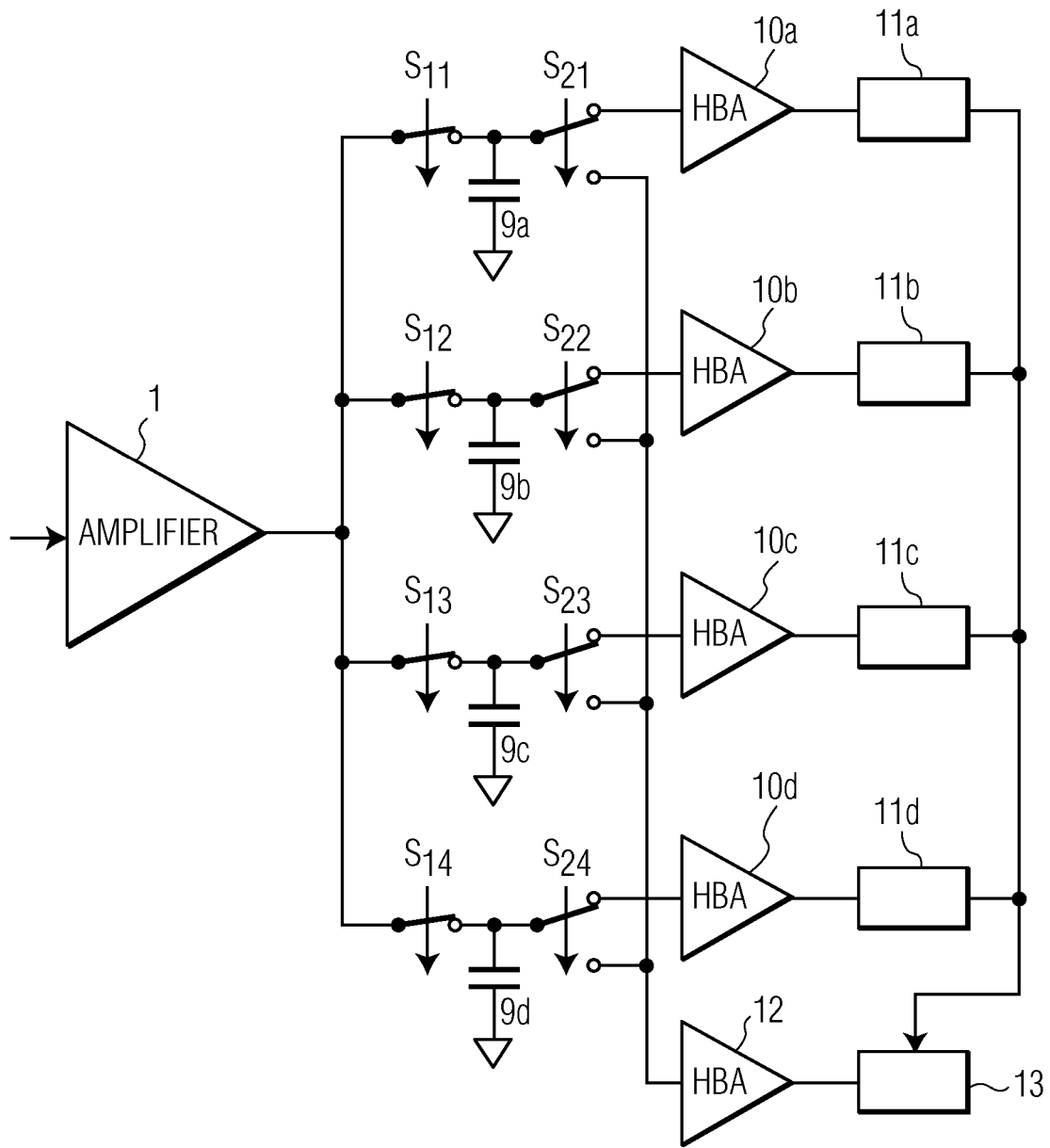
FIG. 4 shows a basic block diagram of the analog-to-digital conversion arrangement according to the invention.

Not only by overranging, but also by the application of interleaving the sample rate can be made higher. Interleaving implies a parallel conversion of successive sample voltages. In the present invention interleaving is only applied for the coarse resolution conversion. Although a number of parallel coarse resolution conversion channels are applied, according to the invention they all make use of the same fine resolution analog-to-digital converter. By applying the same converter for the least significant part of the digital output signal, the effect of possible offset differences between the parallel coarse resolution conversion channels can be eliminated. The more expensive and power consuming fine resolution converter is applied for all the conversion channels. A basic block diagram for the complete analog-to-digital conversion arrangement according to the invention is indicated in FIG. 4. This arrangement gives an implementation of the combination of: interleaved coarse resolution analog-to-digital converters; and one single fine resolution analog-to-digital converter.

Figure 5:
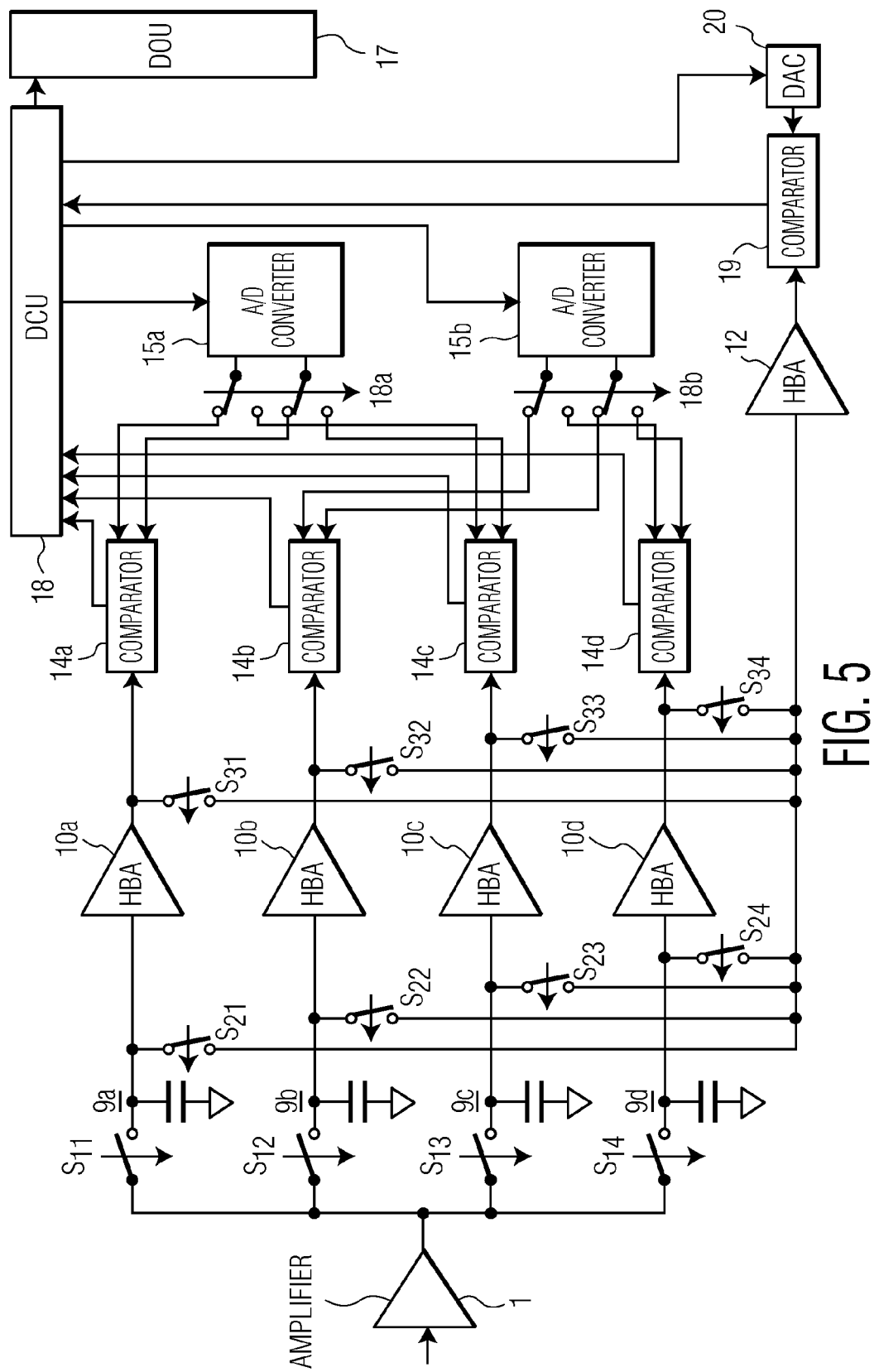
FIG. 5 shows a preferred embodiment of the analog-to-digital conversion arrangement according to the invention.

A more detailed block diagram for a preferred embodiment of such an arrangement is indicated in FIG. 5. In said preferred embodiment the combination of:

interleaved coarse resolution analog-to-digital converters;
one single fine resolution analog-to-digital converter;
successive approximation coarse and fine analog-to-digital converters; and
overranging in the coarse analog-to-digital converter.

Figure 6:
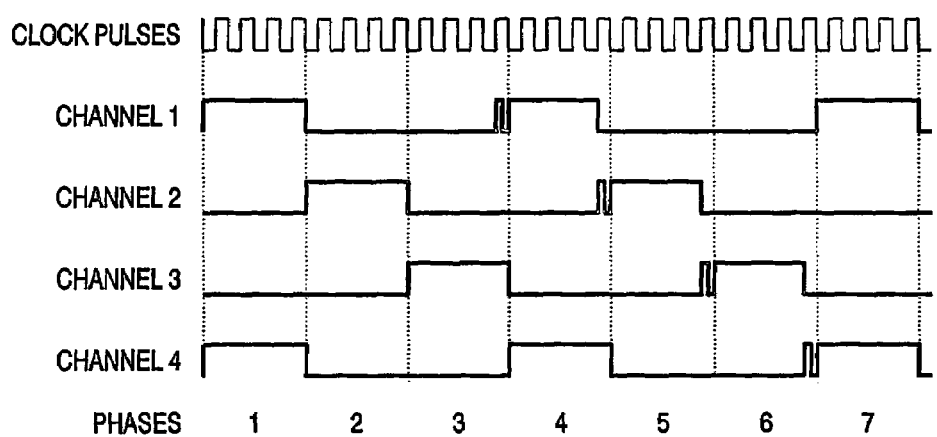
FIG. 6 shows a timing diagram for the switches in the conversion arrangement of FIGS. 4 and 5.

The conversion arrangement will be clarified with reference to FIG. 6 which shows a timing diagram for the switches $S_{11}$–$S_{14}$, $S_{21}$–$S_{24}$ and $S_{31}$–$S_{34}$ in the conversion arrangement of FIGS. 4 and 5. In the present example coarse resolution conversion is performed into 8 bits and fine resolution conversion into 4 bits. So any input sample is converted into 12 bits. A conversion cycle is divided into 16 clock pulses. 4 clock pulses are applied for a sample and hold action, 8 clock pulses for the conversion of the 8 coarse resolution bits and 4 clock pulses for the conversion of the 4 fine resolution bits. This means that an interleaving of 4 coarse resolution channels may be preferred. These channels have a phase difference of 4 clock pulses. The cycles of each 4 clock pulses will further be indicated as phase 1, phase 2, phase 3 and phase 4 respectively.

In FIG. 4, each coarse resolution channel comprises a buffer amplifier 1, a sample- and hold circuit 9a, 9b, 9c and 9d respectively, a hold buffer amplifier 10a, 10b, 10c and 10d respectively, further parts 11a, 11b, 11c and 11d respectively, for coarse analog-to-digital conversion, and for fine resolution conversion a hold buffer amplifier 12 and further parts 13 for fine resolution analog-to-digital conversion.

In the following, with reference to FIG. 6, the interleaving and the co-operation of coarse and fine resolution converters will be given.

In phases 1, 2, 3 and 4 respectively, the switches $S_{11}$, $S_{12}$, $S_{13}$ and $S_{14}$ will successively be closed. The time period of these phases is such, that taking into account the desired sampling rate, the settling time of the sample input voltage values at the input of the subsequent buffer amplifiers 10a, 10b, 10c and 10d is long enough to obtain an accuracy of at least a ½ lsb, i.e. half of the value of the least significant bit of the 12 bits conversion. In the next two phases, the overlapping phases 2 and 3, 3 and 4, 4 and 5, 5 and 6 respectively, coarse conversion is realized in the respective channels. After coarse conversion, in the phases 4, 5, 6 and 7 fine conversion is performed; in these phases the coarse conversion results are successively supplied to the fine resolution converter 13.

In the preferred embodiment of FIG. 5 each coarse resolution channel comprises a successive approximation analog-to-digital converter with overranging. These converters comprise, in accordance with FIG. 1, the buffer amplifier 1, sample- and hold circuit 9a, 9b, 9c and 9d respectively, hold buffer amplifier 10a, 10b, 10c and 10d respectively, comparators 14a, 14b, 14c and 14d respectively, each having two comparator units, analog-to-digital converters 15a and 15b having a coarse resolution, a digital control unit 16 and a digital output unit 17. The coarse resolution analog-to-digital converters in each coarse resolution channel have a common input buffer amplifier, while instead of four analog-to-digital converters, for each channel one, in this embodiment two 8-bits analog-to-digital converters 15a and 15b in combination with switches 18a, 18b are sufficient. The digital control unit 16 and the digital output unit 17 are common for all of the coarse resolution channels.

The fine resolution channel, common for all the coarse resolution channels, comprises a successive approximation analog-to-digital converter without overranging. Again, in accordance with FIG. 1, this converter comprises the said buffer amplifier 1, a sample- and hold circuit formed by successively the above sample- and hold circuits 9a, 9b, 9c and 9d, the hold buffer amplifier 12, a comparator 19, a 12-bits digital-to-analog converter 20 having a fine resolution, and the above digital control unit 16 and digital output unit 17.

The operation of the separate coarse and fine resolution successive approximation analog-to-digital converters is already given above with reference to FIGS. 1, 2A, 2B, 3A and 3B, while the interleaving and the co-operation of coarse and fine converters is already given above with reference to FIG. 6.

In this preferred embodiment, for coarse resolution conversion two digital-to-analog converters 15a and 15b are sufficient. During phases 2 and 3 the switch 18a is in the position, indicated in FIG. 5: analog comparator signals are supplied to comparator 14a. During phases 3 and 4 the switch 18b is in the position, indicated in FIG. 5: analog comparator signals are supplied to comparator 14b. During phases 4 and 5 the switch 18a is in the position, different from that in FIG. 5: analog comparator signals are supplied to comparator 14c. During phases 5 and 6 the switch 18b is in the position, different from that in FIG. 4: analog comparator signals are supplied to comparator 14d. Of course it is possible to use four 8-bits digital-to-analog converters instead of the two converters 15a and 15b with switches 18a and 18b.

During the latter phases the switches $S_{21}$, $S_{22}$, $S_{23}$ and $S_{24}$ are successively closed. Before fine resolution conversion is performed, a pre-charge of the input capacitor of the buffer amplifier 12 is preferred. By this measure a charge redistribution between the capacitor of the respective sample- and hold circuit and the input capacitor of the buffer amplifier 12 is reduced or overcome. Therefore, directly before the switching of the switches $S_{21}$, $S_{22}$, $S_{23}$ and $S_{2,4}$ further switches $S_{31}$, $S_{32}$, $S_{33}$ and $S_{34}$ are successively closed during a fraction of a clock period.

In summary, the invention relates to an analog-to-digital conversion arrangement using interleaved analog-to-digital converters, preferably successive approximation analog-to-digital converters. The arrangement according to the invention results in a very efficient hardware implementation where several circuits are shared by the interleaved converters. In this way offset and gain problems between the converters are decreased. Also hardware complexity is low. A further advantage is that the arrangement according to the invention has a low power consumption.

The analog-to-digital conversion arrangement here described may cooperate with analog input anti-aliasing filter and digital output decimation filter arrangements. It appeared that in the present analog-to-digital conversion arrangement the buffers that are used at the output in the sample- and hold circuits are dominant in power consumption, even if the interleaving is oversampled some times compared with the analog bandwidth of the buffers. Active filter sections in front of the buffer for anti-aliasing consume as much power and add as much noise and distortion as the buffers do. So, oversampling is an attractive solution to save power in the anti-aliasing filter and it also prevents folding back of distortion which is a typical problem for Nyquist converters. These considerations make the system particularly valuable for application in arrangements for processing video or communication signals wherein high speed data conversion is required. Practible values that seem to be feasible for an interleaving successive approximation analog-to-digital converter in CMOS technology are an analog bandwidth of 20 MHz and 4 times oversampling at 160 Ms/s at a clock frequency of 640 MHz.

The embodiment of the present invention described herein is intended to be taken in an illustrative and not limiting sense. Various modifications may be made to this embodiment by persons skilled in the art without departing from the scope of the present invention as defined in the appended claims. For instance, the coarse as well as the fine resolution conversion can be performed for 6 bits, again resulting in a 12 bits conversion. In that case the conversion time can be divided in three phases, each during 6 clock pulses, one for sampling and hold, a second for coarse resolution conversion and a third for fine resolution conversion, so that three interleaving channels can be used. Of course, conversion in a different number of bits is possible.

The invention claimed is:

1. An analog-to-digital conversion arrangement for converting an analog input signal into a digital output signal with a most significant part and a least significant part, comprising sample means for sampling the analog input signal, a plurality of coarse resolution analog-to-digital converters for converting the sampled analog input signal into a coarse digital signal representing the most significant part of the digital output signal, whereby the coarse resolution analog-to-digital converters are operated in an interleaved way, characterized in that the analog-to-digital conversion arrangement further comprises a fine resolution analog-to-digital converter for converting the sampled analog input signal into a fine digital signal representing the least significant part of the digital output signal, based upon the coarse digital signal generated by any of said coarse resolution analog-to-digital converters.

2. An analog-to-digital conversion arrangement as claimed in claim 1, characterized in that the coarse resolution analog-to-digital converters are successive approximation analog-to-digital converters.

3. An analog-to-digital conversion arrangement as claimed in claim 2, characterized in that each of the coarse resolution successive approximation analog-to-digital converters comprises separately a sample-and-hold circuit, a hold buffer amplifier connected thereto, at least one comparator and a coarse resolution digital-to-analog converter, the inputs of said at least one comparator being connected to said hold buffer amplifier and said coarse resolution digital-to-analog converter, the analog-to-digital conversion arrangement further comprising a common digital control unit connected to the outputs of the comparators of the coarse resolution successive approximation analog-to-digital converters.

4. An analog-to-digital conversion arrangement as claimed in claim 3, characterized in that a pair of coarse resolution analog-to-digital converters has a common coarse digital-to-analog converter which in combination with switches is operating in two interleaved coarse resolution analog-to-digital converters.

5. An analog-to-digital conversion arrangement as claimed in claim 3, characterized in that the fine resolution analog-to-digital converter comprises a hold buffer amplifier successively connected to the said sample-and-hold circuits by means of switches, at least one comparator and a fine resolution digital-to-analog converter, the input of said at least one comparator being connected to said hold buffer amplifier and said coarse resolution digital-to-analog converter and having at least one output connected to said common digital control unit.

6. An analog-to-digital conversion arrangement as claimed in claim 3, characterized in that, in order to reduce a charge redistribution between the capacitors of the respective sample-and-hold circuits and the input capacitor of the buffer amplifier of the fine resolution analog-to-digital converter, switches are provided for successively briefly connecting the latter buffer amplifier to the sample-and-hold circuits.

7. A system for signal processing comprising an analog-to-digital conversion arrangement as claimed in claim 1.

8. A system as claimed in claim 7, characterized in that the system is arranged for processing video or communication signals.

9. An analog-to-digital conversion arrangement as claimed in claim 1, characterized in that the fine resolution analog-to-digital converter is a successive approximation analog-to-digital converter.

10. An analog-to-digital conversion arrangement as claimed in claim 1, characterized in that the coarse resolution analog-to-digital converters are overranging successive approximation analog-to-digital converters.

11. A method for converting an analog input signal into a digital output signal with a most significant part and a least significant part, comprising: sampling the analog input signal by sampling means; converting the sampled analog input signal into a coarse digital signal by a plurality of coarse resolution analog-to-digital converters operated in an interleaved way, the coarse digital signal representing the most significant part of the digital output signal, characterized in that the method further comprises: converting the sampled analog input signal into a fine digital signal by a fine resolution analog-to-digital converter and using the coarse digital signal generated by any of said coarse resolution analog-to-digital converters, the fine digital signal representing the least significant part of the digital output signal.

* * * * *